March 4, 1958 J. C. SIMS, JR 2,825,820
ENHANCEMENT AMPLIFIER
Filed May 3, 1955 2 Sheets-Sheet 1
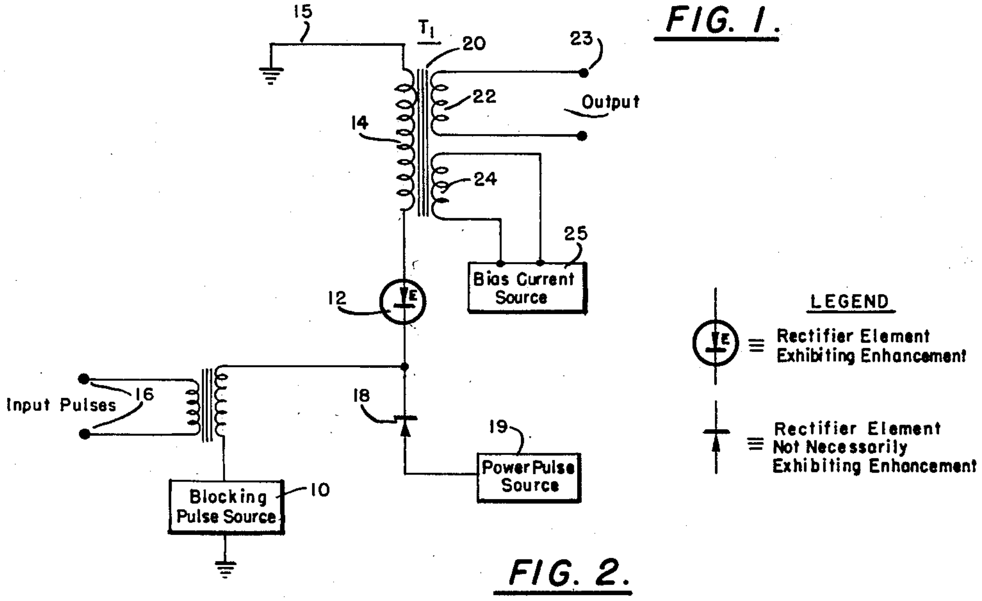
FIG. 1. FIG. 2.
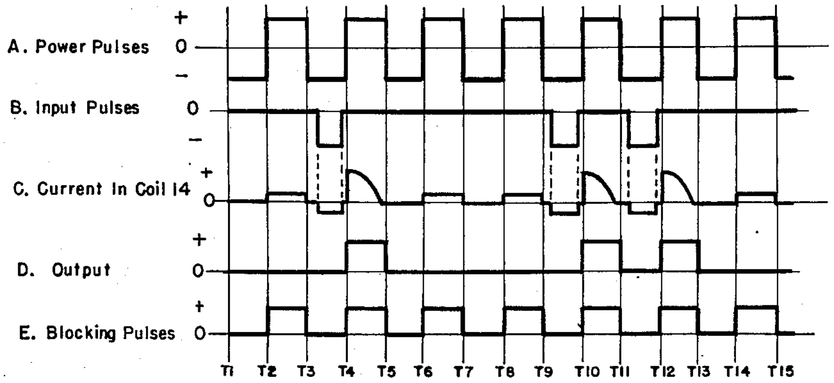
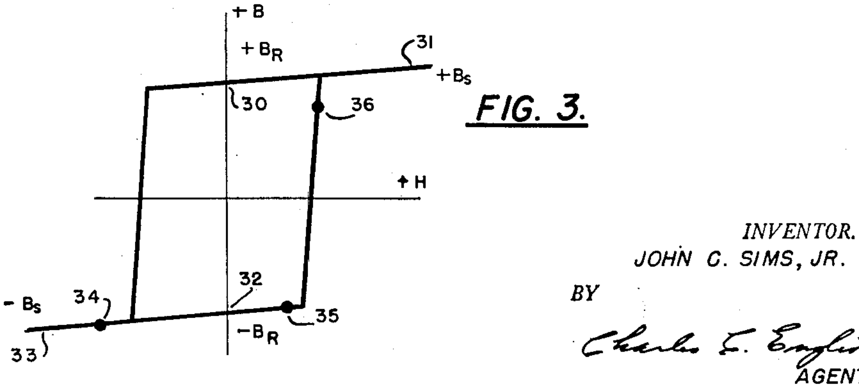
FIG. 3.
INVENTOR.
JOHN C. SIMS, JR.
BY
Charles E. English
AGENT March 4, 1958 J. C. SIMS, JR 2,825,820
ENHANCEMENT AMPLIFIER
Filed May 3, 1955 2 Sheets-Sheet 2

INVENTOR.
JOHN C. SIMS, JR.
BY
Charles C. English
AGENT 2,825,820

ENHANCEMENT AMPLIFIER

John C. Sims, Jr., Springhouse, Pa., assignor, by mesne assignments, to Sperry Rand Corporation, New York, N. Y., a corporation of Delaware Application May 3, 1955, Serial No. 505,707

19 Claims. (Cl. 307—88)

The present invention relates to amplifier structures and more particularly relates to such structures relying for their operation upon reverse transient phenomena observed in semiconducting devices.

In general, a semiconducting device may be defined as one presenting a relatively low impedance to current flow in a forward direction and presenting a relatively high impedance to current flow in an opposing or back direction. In this respect, therefore, forward currents may be effected through a semiconductor by applying a potential thereto, rendering the anode more positive than the cathode thereof; and if inverse voltage is applied to such a semiconductor, only a negligible back current ordinarily flows.

In practice it has been found, however, that when a semiconductor has a forward current flowing therethrough, this forward current will tend to effect a storage of excess holes or electrons in the lattice of the solid state material utilized, whereupon if such a semiconductor should then be suddenly subjected to an inverse voltage large enough to cut off the forward current, a large reverse transient current initially flows which may in fact exceed the forward current in magnitude. This transient current ordinarily decays after a relatively short time interval to the normal value of back leakage current, and results from the applied inverse voltage sweeping out unrecombined injected carriers from the semiconductor device. The large transient current effected by the applied inverse voltage is termed "enhancement"; and this enhancement phenomenon is exhibited in some degree by all semiconductors utilizing material into which minority carriers can be injected, such as germanium and silicon.

The present invention relates to amplifier devices utilizing this enhancement effect, previously considered undesirable, in the provision of improved amplifier devices for electronic applications such as computation and control circuits.

It is accordingly an object of the present invention to provide an improved amplifier device.

A further object of the present invention resides in the provision of an amplifier device utilizing a semiconductor rectifier.

A still further object of the present invention resides in the provision of an amplifier device utilizing in its operation enhancement effects observed in semiconductor rectifiers.

A still further object of the present invention resides in the provision of amplifier devices which may be made in relatively small sizes.

Still another object of the present invention resides in the provision of an improved amplifier which is inherently pulse forming and pulse timing.

A still further object of the present invention resides in the provision of a compatible amplifier utilizing plural amplifier stages employing semiconductor rectifiers.

Another object of the present invention resides in the provision of an improved amplifier device utilizing semiconductor rectifiers which may be utilized as a delay element or as a shifting register.

In accordance with the present invention, there is used a semiconductor rectifier exhibiting enhancement effects in the provision of amplifier structures. In practice, such a rectifier may have a utilization circuit coupled to one terminal thereof and this utilization circuit is preferably responsive to current flows in a predetermined direction exceeding a predetermined minimum. In operation, and when an output is desired to the said utilization circuit, current is initially caused to flow through the said semiconductor rectifier in a forward direction, subsequent to which a large inverse voltage is applied to the said rectifier causing enhancement current to flow therethrough in a reverse direction, which enhancement current may be employed to effect a desired output from the said utilization circuit.

In a preferred form of the present invention, the utilization circuit may include a transformer preferably but not necessarily, employing a core of magnetic material exhibiting a substantially rectangular hysteresis loop; and the transformer is so biased that it is responsive primarily to enhancement currents exceeding a predetermined minimum. By this arrangement sneak current and spurious current flows are substantially ineffective in producing a desired output from the said utilization circuit, whereby a relatively small amplifier device, having extremely good operating characteristics is effected.

The foregoing objects, advantages, construction and operation of the present invention will become more readily apparent from the following description and accompanying drawings, in which:

Figure 1 is a schematic diagram of an enhancement amplifier in accordance with the present invention and includes a legend identifying the symbols employed.

Figure 2 (A through E) are waveform diagrams illustrating the operation of the circuit shown in Figure 1.

Figure 3 is an idealized representation of the hysteretic characteristic of core materials which may preferably, but not necessarily, be employed in the arrangement of Figure 1.

Figure 4:
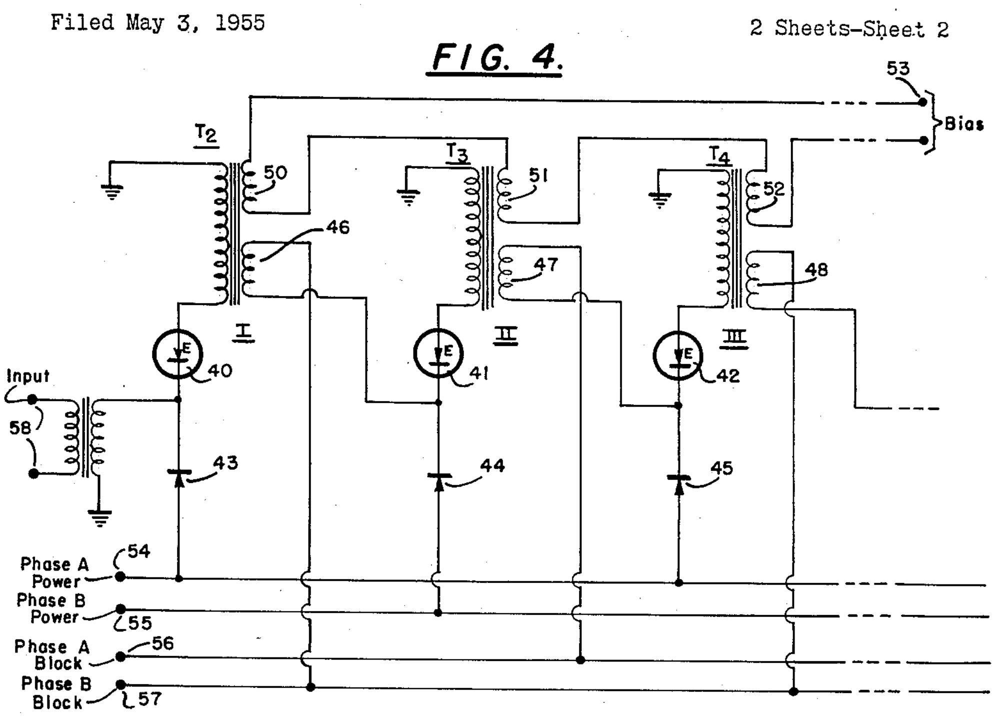
Figure 4 is a schematic diagram of a compatible amplifier constructed in accordance with the present invention and capable of operating as a delay element, as a cascade coupled amplifier, and/or as a shifting register.

Referring now to Figure 1, it will be noted that an amplifier device in accordance with the present invention may comprise a hysteresis element such as a semiconductor rectifier 12. The said rectifier 12 may in fact take the form of a semiconductor diode and this rectifier is characterized by the fact that it can be selectively caused to conduct a relatively high transient current in its back or normally non-conducting direction, due to the storage of excess holes or electrons in the lattice structure thereof during a previous history of conduction in a forward direction. In short, the semiconductor rectifier 12 is so chosen that it exhibits substantial "enhancement." One terminal of the said rectifier 12 (the anode thereof in the arrangement shown in Figure 1) is coupled to a winding 14 of a transformer $T_1$, and the other end of the said winding 14 is preferably grounded at a point 15.

Transformer $T_1$, in addition, comprises a core 20 of magnetic material, preferably but not necessarily exhibiting a hysteresis loop which is substantially rectangular in configuration. The core material may, for instance, comprise 4–79 Molypermalloy, Orthonik, or other materials exhibiting hysteresis loops of the type shown in Figure 3, such materials being well known in the art. Transformer $T_1$ further carries an output winding 22 thereon whereby outputs may be taken selectively at a point 23; and in addition, includes bias means such as a winding 24 coupled to a source of bias current 25 for causing the said transformer $T_1$ to operate at a predetermined point on its hysteresis loop under quiescent conditions.

The lower terminal of the rectifier 12 (the cathode in the arrangement of Figure 1) is coupled to one terminal of a further rectifier 18 which may again comprise a semiconductor rectifier or other form of rectifier known in the art, and the rectifier element 18 need not necessarily exhibit enhancement, although, as will become apparent from the subsequent discussion, the occurrence of enhancement effects in the said rectifier 18 will not detract from the operation of the circuit. Rectifier element 18 is poled in a direction opposite to that of rectifier element 12, and a source 19 of regularly occurring positive and negative-going driving pulses, of the configuration shown in Figure 2A, is coupled to the lower terminal, or anode, of the said rectifier 18. A source 16 of selective input pulses, of the configuration shown in Figure 2B, may also be coupled to the common electrode connection of the rectifiers 12 and 18, for instance via an input transformer whereby the device operates in the manner subsequently to be described. A source 10 of blocking pulses (Figure 2E) may be provided to prevent interaction between the input 16 and the power source 19.

It should be noted that while the circuit of Figure 1 has the cathodes of the rectifiers 12 and 18 coupled to one another, this particular connection is not mandatory, and in fact the anodes of the said two rectifiers may be coupled to one another, provided the polarities of input pulse source 16 and bias current source 25 are appropriately changed.

Considering now the broad operational characteristics of the circuit shown in Figure 1, it will be noted that, in general, no current may flow in the series circuit comprising rectifiers 18 and 12, transformer winding 14 and ground connection 15, due to the application of power pulses from the source 19. When these power pulses are positive-going in nature, current flow is normally blocked by the rectifier 12; while, when they are negative-going in nature, it is blocked by the rectifier 18. If an input pulse should be applied to the terminal 16, however, during the application of a negative-going power pulse from the source 19, the rectifier 12 will be caused to conduct in a forward direction, thereby storing holes or electrons in its lattice structure, whereupon subsequent application of a positive-going power pulse from the source 19 will effect an appreciable current flow through the series circuit comprising forward current flow through the rectifier 18, and enhancement current flow through the rectifier 12. This appreciable current flow passes through the winding 14 of transformer $T_1$ to ground terminal 15, whereby a usable output may be taken across the transformer winding 22 at the terminal 23.

The foregoing operation of the present invention will become more readily apparent from a consideration of the waveforms shown in Figure 2, and of the hysteresis loop shown in Figure 3. Referring initially to the said Figure 3, it will be noted that the core 20 may comprise a material exhibiting a substantially rectangular hysteresis loop and such a core material may exhibit a plus remanence point of operation 30, a plus saturation region 31, a minus remanence point of operation 32 and a minus saturation region 33. The D. C. bias current from source 25 applied to winding 24 of the said transformer $T_1$ is so chosen in magnitude that the core 20 operates during quiescent conditions at a point 34 in its minus saturation region, and this quiescent operating condition serves to provide a threshold for the operation of the transformer $T_1$ whereby relatively small positive and negative current flows through the winding 14 are substantially ineffective in producing usable outputs at the terminal 23.

Considering the waveforms of Figure 2, it will be seen that the power pulses applied to the anode of rectifier 18 exhibits regularly occurring positive and negative-going excursions. During a time interval $t1$ to $t2$, for instance, a negative-going pulse may be applied from the source 19 and this negative-going pulse will be ineffective in causing current flow inasmuch as rectifier 18 will be disconnected. During a next subsequent time interval, $t2$ to $t3$, a positive-going power pulse from the source 19 tends to cause current conduction in the series circuit described. This current conduction is limited to the relatively small value of back current flow through the rectifier 12 and is represented by the small positive-going current through coil 14, shown in Figure 2C for this time interval. Due to the biasing of transformer $T_1$, described previously, this small current flow in a positive direction (that is to ground) through winding 14, may drive the core 20 from its initial operating point 34 to a further operating point 35. As will be seen from an examination of Figure 3, however, the points 34 and 35 each comprise operating points in a relatively saturated region of the core 30, whereby the small positive current flow effected by application of a positive-going power pulse during the time interval $t2$ to $t3$ effects a relatively small flux change in the core 20 and substantially no output appears at the terminal 23. This small output may in fact be completely suppressed by a clamp circuit coupled to the said output winding 22. Thus, in the absence of input pulses, the positive and negative-going power pulses from the source 19 produce no output at the terminal 23.

If now a negative-going input pulse should be applied from the source 16, during a time interval $t3$ to $t4$, this input pulse will lower the cathode of rectifier element 12, whereby a small current flow will pass through the said rectifier 12 from ground and through the transformer winding 14. This small current flow through winding 14, due to the application of an input pulse from source 16, is again ineffective in producing an output at terminal 23, inasmuch as it tends to drive the core 20 from its operating point 34 deeper into its negative saturation region 33, again producing substantially no flux change in the said core 20. The forward current flow through rectifier 12, due to the application of an input pulse from source 16, stores holes or electrons in the lattice structure of the semiconductor rectifier 12, however, whereupon a positive-going power pulse from the source 19, during the time interval $t4$ to $t5$ will effect a relatively large current flow through the series circuit, comprising forward current through the rectifier 18 and enhancement current through the rectifier 12.

The relatively large current thus effected passes through transformer winding 14 to ground point 15 and is substantially transient in nature, as shown in Figure 2C for the time interval $t4$ to $t5$. This transient current is of sufficient magnitude, however, to drive core 20 from its operating point 34 to operating point 36, in an unsaturated region thereof, or may in fact be of sufficient magnitude to drive the said core into its positive saturation region 31. In any case, the relatively large transient current through winding 14 of transformer $T_1$ effects a relatively large flux change in the core 20 whereby a substantial potential is induced in winding 22 and may be taken at output point 23. Due to the configuration of transformer $T_1$ moreover, these output signals are properly shaped for utilization in subsequent circuits.

During a next subsequent time interval $t5$ to $t6$, the bias source 25 drives the core 20 from its operating point 36 or 31 back into its negative saturation region, to point 34 preparatory to further application of an input signal. This "resetting" operation of the bias source tends to effect a positive-going "kick" in the winding 14 (for instance, at time $t5$) but this "kick" is again ineffective due to the polarity of the enhancement rectifier 12. Similar considerations apply to the arrangement of Figure 4, and the waveforms of Figure 5, to be discussed.

A further operating sequence, corresponding to the application of two successive input signals, is shown for the time interval $t9$ to $t15$, and the operation of the device for this further time interval is analogous to that described previously.

As will be apreciated from the foregoing, the transformer $T_1$ cooperates with the semiconductor or enhancement amplifier in such a manner that sneak signals present in the winding 14 are completely ineffective in producing outputs at the terminal 23; and in addition, the arrangement serves to shape output signals appearing at the said terminal 23 due to the application of an input signal from source 16. It should further be noted that, while rectifier 18 may have less enhancement than rectifier 12, this is by no means mandatory. Satisfactory operation will be obtained even when rectifier 18 has enhancement, so long as the input signal is delayed sufficiently to permit the enhancement current of rectifier 18 to be drained off. It will be observed that during time periods when transformer $T_1$ is operating in its negative saturation region, its impedance to the flow of current is small and in fact may appear as essentially a short-circuit. Thus, even if rectifier 18 should exhibit appreciable enhancement effects, the negative portions of applied power pulses from source 19 will readily pull enhancement current out of the rectifier 18, since electrons will flow readily from ground through winding 14 and through rectifier 12 in its forward direction. The rectifier 18 will thus rapidly be cleaned up and the clean-up currents flowing in coil 14 are ineffective in providing outputs at terminal 23, inasmuch as the core 20 is operating in its negative saturation region and the said clean-up currents are of such polarity as to drive the said core 20 deeper into its said negative saturation region. Any enhancement of rectifier 12 by power pulses during such clean up of rectifier 18 decays by recombination, and suitable power pulse rates to permit such recombination may be provided.

The circuit shown in Figure 1 may be utilized to effect a single stage amplifier, operating in the manner described above, or may be employed as one stage of a plural stage amplifier. Thus, as shown in Figure 4, a plurality of stages I, II, III, etc. may be coupled to one another whereby a compatible amplifier circuit is effected; and this compatible amplifier circuit may further be employed as a delay element and/or as a shifting register.

Referring to Figure 4, it will be seen that, in accordance with one form of the present invention, such an amplifier arrangement may comprise a first plurality of semiconductor rectifiers 40, 41, 42, etc. exhibiting enhencement effects. A second plurality of rectifiers 43, 44, 45, etc., not necessarily exhibiting enhancement, and a plurality of transformers $T_2$, $T_3$, $T_4$, etc. Each of the individual amplifier stages corresponds to that already discussed in reference to Figure 1; and the output of each stage is coupled to the input of the next successive stage. Thus, transformers $T_2$, $T_3$, $T_4$, etc. may each include an output winding 46, 47, 48, etc., and these output windings are coupled, as shown, to the common electrode connection of the two semiconductor elements comprising the next successive amplifier stage. The said transformers further include bias windings 50, 51, 52, etc. coupled to a source of bias current 53 whereby said transformers quiescently operate in their negative saturation regions in accordance with the preceding discussion.

Inasmuch as each amplifier stage imposes an inherent delay between the application of an input pulse thereto and the subsequent occurrence of an output pulse therefrom, plural sources of power pulses 54 and 55, termed "phase A power" and "phase B power," respectively, are employed. These power pulses from sources 54 and 55 again exhibit positive and negative-going excursions and are so timed with respect to one another that a positive-going excursion of one occurs during a negative-going excursion of the other, as shown in Figures 5C and 5D.

Alternate stages of the compatible amplifier shown in Figure 4 are coupled to phase A power pulses supplied by source 54, while the intermediate stages therebetween are coupled to phase B power pulses, supplied by source 55. It will also be noted that due to the relatively low impedance of the power pulse sources employed it is necessary to open the several rectifiers 43, 44 and 45 for brief time intervals between operating cycles, so that bias current appearing in the windings 50, 51 and 52, for instance, may reset the several cores of the transformers employed. To provide for this function, therefore, phase A blocking pulses and phase B blocking pulses, of the configurations shown in Figures 5A and 5B, are supplied respectively from sources 56 and 57 to alternate amplifier stages, and these blocking pulses may in fact be coupled, as shown, to the output windings 46, 47, 48, etc., whereby they are effectively coupled to the common electrode connection of the stages II, III, etc. A source of selective input pulses, of the type described previously, may be applied to terminals 58 to cause operation of the device in accordance with the preceding discussion.

Figure 5:
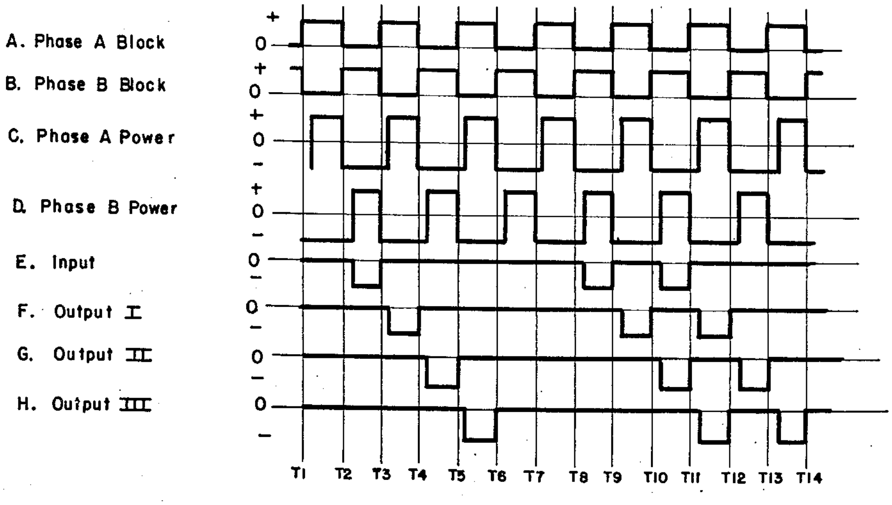
Figure 5 (A through H) are waveform diagrams illustrating the operation of the circuit shown in Figure 4.

Referring now to the waveforms of Figure 5, it will be seen that, in the absence of an input pulse, no output will appear from any of the stages I, II, III, etc., during a time interval $t1$ to $t2$. If now a negative-going input pulse should be applied to the terminals 58 during a time interval $t2$ to $t3$, this applied input pulse will fall forward current through rectifier 40 from ground in the manner described previously, thus storing holes or electrons in its lattice structure. Amplifier stage I is, as shown, energized by phase A power pulses, and the next such positive-going pulse occurring, for instance, during the time interval $t3$ to $t4$, will drive enhancement current through the rectifier 40 and through the primary winding of transformer $T_2$, effecting an appreciable output across the winding 46. This output across winding 46 acts as a further input to amplifier stage II whereby forward current is drawn through the semiconductor element 41 from ground to condition it for the subsequent application of a positive-going phase B power pulse from the source 55; and the application of such a phase B power pulse during the time interval $t4$ to $t5$ will again effect an output across the winding 47 during this time interval.

The output of stage II, occurring during time interval $t4$ to $t5$, acts as an input to stage III, drawing forward current through the rectifier 42, whereupon the next subsequent application of a positive-going phase A power pulse occurring during the time interval $t5$ to $t6$, will drive enhancement current through the rectifier 42 and through the primary of transformer $T_4$, again inducing an output in winding 48 which will act as an input to a next subsequent amplifier stage.

A still further operating sequence, corresponding to the application of two successive input pulses to the terminal 58, has been shown for the time interval $t8$ to $t14$, and the operation of the device for this further time interval is analogous to that given above. As will be appreciated by a comparison of Figures 5E through 5H inclusive, the application of an input pulse to terminal 58 causes successive output pulses to be effected by the amplifier stages I, II, III, etc. during succeeding time intervals, whereby the device acts as a cascade-coupled amplifier, as a delay element, and/or as a shifting register with enhancement intermediate storage. In this latter respect, if the system output should be coupled to the system input, the circuit of Figure 4 may operate as a ring counter.

While I have described a preferred embodiment of the present invention, many variations will be suggested to those skilled in the art. The foregoing description is meant, therefore, to be illustrative only and is not limitative of my invention, and all such modifications as are in accord with the principles discussed above are intended to fall within the scope of the appended claims.

A gate and buffer circuit employing features of this invention is described in applicant's copending application S. N. 505,709, filed concurrently herewith.

Having thus described my invention, I claim:

1. An amplifier circuit comprising first and second rectifiers, at least said second rectifier exhibiting substantial enhancement effects, means coupling one electrode of said first rectifier to the like electrode of said second rectifier, a source of driving pulses coupled to the other electrode of said first rectifier, a utilization circuit including a core of magnetic material having first and second windings thereon, said other electrode of said second rectifier being coupled to said first winding, means for taking an output from said second winding, and means selectively coupling input pulses to the common electrode connection of said first and second rectifiers.

2. An amplifier circuit comprising first and second semiconductor rectifiers, at least said first rectifier exhibiting substantial enhancement effects, means coupling one electrode of said first rectifier to the like electrode of said second rectifier, a utilization circuit coupled to the other electrode of said first rectifier whereby enhancement current may flow selectively through said first rectifier to said utilization circuit, a source of driving pulses coupled to the other electrode of said second rectifier, and means selectively coupling input signals to said first rectifier thereby to effect conduction of said first rectifier in a forward direction, said driving pulses being of such polarity that they tend to drive enhancement current through said first rectifier in a reverse direction subsequent to conduction of said first rectifier in said forward direction.

3. An amplifier comprising a series connected circuit including first and second rectifiers of opposite polarity to one another, a drive source coupled to one end of said series circuit, a transformer coupled to the other end of said series circuit, and control means for selectively effecting forward current flow through one of said rectifiers whereby said drive source may thereafter effect appreciable reverse current flow through said one of said rectifiers to said transformer.

4. An amplifier comprising first and second rectifiers of opposite polarity connected in series with one another, at least said first rectifier comprising a semiconductor material exhibiting enhancement, a drive source coupled to one end of said series connected rectifiers, a transformer coupled to the other end of said series connected rectifiers, and control means for selectively effecting forward current flow through said first rectifier whereby said drive source may thereafter effect enhancement current flow through said first rectifier to said transformer.

5. A control circuit comprising a plural amplifier stages, means coupling the output of each stage to the input of a next sucessive stage, each of said stages comprising first and second rectifiers connected in series with one another and of opposite polarity to one another, said first rectifier exhibiting substantial enhancement effects and driving means coupled to one end of each of said series connected rectifiers, the output of each stage being taken from the other end of said series connected rectifiers and the input of each stage comprising a circuit point intermediate said first and second rectifiers.

6. A control circuit comprising a plurality of amplifier stages connected in cascade, each of said stages comprising first and second rectifiers connected in series with one another and of opposite polarity to one another, each of said stages further including a source of driving pulses coupled to one end of said series connected rectifiers and a transformer coupled to the other end of said series connected rectifiers, at least said first rectifier in each stage comprising a semiconductor element exhibiting enhancement, means for selectively applying control signals to the said first semiconductor element of a first one of said amplifier stages, and means coupling an output winding on the transformer of each of said stages to the first semiconductor element in the next successive amplifier stage.

7. An information storage register comprising a plurality of amplifier stages connected in cascade, each of said stages including a semiconductor device exhibiting enhancement, control means selectively effecting forward current flow through selected ones of said semiconductor devices thereby to condition different ones of said devices during different time intervals, and drive means operative at a time subsequent to operation of said control means for effecting enhancement current in a reverse direction through said conditioned semiconductor devices whereby said enhancement effects intermediate storage between successive ones of said stages.

8. An amplifier comprising a core of magnetic material, means conditioning said core for operation at a preselected hysteretic operating point, a winding on said core, a pair of oppositely poled semiconductor rectifiers connected in series with one another and with said winding, means selectively conditioning one of said rectifiers for reverse current flow therethrough, and means for thereafter driving current through said series connected rectifiers, in a reverse direction through said conditioned rectifier, whereby appreciable current flows in said winding thereby to drive said core from said preselected hysteretic operating point to another operating point.

9. An amplifier comprising a core of magnetic material exhibiting a substantially rectangular hysteresis loop, bias means saturating said core in a predetermined direction, a winding on said core, a pair of oppositely poled rectifiers in series with said winding, means conditioning one of said rectifiers for reverse current flow therethrough, and means for thereafter driving current through said pair of rectifiers, in a reverse direction through said conditioned rectifier, and through said winding, the polarity and magnitude of said current being such that said core is driven into an unsaturated region of its hysteresis loop.

10. An amplifier circuit comprising first and second rectifiers, at least said second rectifier exhibiting substantial enhancement effects, means coupling one electrode of said first rectifier to the like electrode of said second rectifier, a source of driving pulses coupled to the other electrode of said first rectifier, a utilization circuit including a core of magnetic material having first and second windings thereon, said material exhibiting a substantially rectangular hysteresis loop, said other electrode of said second rectifier being coupled to said first winding, means for taking an output from said second winding, and means selectively supplying input pulses to the common electrode connection of said first and second rectifiers.

11. An amplifier circuit comprising first and second rectifiers, at least said second rectifier exhibiting substantial enhancement effects, means coupling one electrode of said first rectifier to the like electrode of said second rectifier, a source of driving pulses coupled to the other electrode of said first rectifier, a utilization circuit including a core of saturable magnetic material having first and second windings thereon, said other electrode of said second rectifier being coupled to said first winding, means for taking an output from said second winding, means selectively supplying input pulses to the common electrode connection of said first and second rectifiers, and means for biasing said core into a preselected saturation region in the absence of said selectively supplied input pulses.

12. An amplifier circuit comprising first and second semiconductor rectifiers, at least said first rectifier exhibiting substantial enhancement effects, means coupling one electrode of said first rectifier to the like electrode of said second rectifier, a utilization circuit coupled to the other electrode of said first rectifier whereby enhancement current may flow selectively through said first rectifier to said utilization circuits, said utilization circuit including a transformer having one coil thereof coupled to said other electrode of said first rectifier, a source of driving pulses coupled to the other electrode of said second rectifier, and means selectively coupling input signals to said first rectifier thereby to effect conduction of said first rectifier in a forward direction, said driving pulses being of such polarity that they tend to drive enhancement current through said first rectifier in a reverse direction subsequent to condition of said first rectifier in said forward direction.

13. An amplifier circuit comprising first and second semiconductor rectifiers, at least said first rectifier exhibiting substantial enhancement effects, means coupling one electrode of said first rectifier to the like electrode of said second rectifier, a utilization circuit coupled to the other electrode of said first rectifier whereby enhancement current may flow selectively through said first rectifier to said utilization circuit, said utilization circuit including a transformer having one coil thereof coupled to said other electrode of said first rectifier, and a core of magnetic material exhibiting a substantial rectangular hysteresis loop, a source of driving pulses coupled to the other electrode of said second rectifier, and means selectively coupling input signals to said first rectifier thereby to effect conduction of said first rectifier in a forward direction, said driving pulses being of such polarity that they tend to drive enhancement current through said first rectifier in a reverse direction subsequent to conduction of said first rectifier in said forward direction.

14. An amplifier comprising first and second rectifiers of opposite polarity connected in series with one another, at least said first rectifier comprising a semiconductor material exhibiting enhancement, a drive source coupled to one end of said series connected rectifiers, a transformer coupled to the other end of said series connected rectifiers, said transformer including threshold producing means whereby said transformer is responsive only to current flows of a predetermined polarity and in excess of a predetermined minimum value, and control means for selectively effecting forward current flow through said first rectifier whereby said drive source may thereafter effect enhancement current flow through said first rectifier to said transformer.

15. The amplifier of claim 14 wherein said threshold producing means comprises bias means saturating said core in a preselected orientation.

16. An amplifier comprising first and second rectifiers of opposite polarity connected in series with one another, at least said first rectifier comprising a semiconductor material exhibiting enhancement, a drive source coupled to one end of said series connected rectifiers, said drive source including means producing regularly spaced driving pulses, a transformer coupled to the other end of said series connected rectifiers, and control means for selectively effecting input forward current flow through said first rectifier in the spaces between said driving pulses whereby said drive source may thereafter effect enhancement current flow through said first rectifier to said transformer.

17. A control circuit comprising plural amplifier stages, means coupling the output of each stage to the input of a next successive stage, each of said stages comprising first and second rectifiers connected in series with one another and of opposite polarity to one another, said first rectifier exhibiting substantial enhancement effects, driving means coupled to one end of each of said series connected rectifiers, the input of each stage comprising a circuit point intermediate said first and second rectifiers, and plural transformers each of which has a first winding thereof coupled to the other end of a different one of said series connected rectifiers, the output of each stage being taken from a second winding on its respective transformer.

18. A control circuit comprising plural amplifier stages, means coupling the output of each stage to the input of a next successive stage, each of said stages comprising first and second rectifiers connected in series with one another and of opposite polarity to one another, said first rectifier exhibiting substantial enhancement effects and driving means coupled to one end of each of said series connected rectifiers, said driving means including means effecting regularly occurring pulses of first and second phases, means coupling said effecting means to apply those pulses of said first phase to alternate ones of said amplifier stages, and means coupling said effecting means to apply those pulses of said second phase to the remaining ones of said amplifier stages, the output of each stage being taken from the other end of said series connected rectifiers and the input of each stage comprising a circuit point intermediate said first and second rectifiers.

19. A control circuit comprising a plurality of amplifier stages connected in cascade, each of said stages comprising first and second rectifiers connected in series with one another and of opposite polarity to one another, each of said stages further including a source of driving pulses coupled to one end of said series connected rectifiers and a transformer coupled to the other end of said series connected rectifiers, each of said transformers including a core of magnetic material exhibiting a substantially rectangular hysteresis loop, at least said first rectifier in each stage comprising a semiconductor element exhibiting enhancement, means for selectively applying control signals to said first semiconductor element of a first one of said amplifier stages, and means coupling an output winding on the transformer of each of said stages to said first semiconductor element in the next successive amplifier stage.

References Cited in the file of this patent

UNITED STATES PATENTS

| | | |
|---|---|---|
| 2,627,575 | Meacham et al. | Feb. 3, 1953 |
| 2,647,995 | Dickinson | Aug. 4, 1953 |
| 2,651,728 | Wood | Sept. 8, 1953 |
| 2,652,501 | Wilson | Sept. 15, 1953 |
| 2,666,816 | Hunter | Jan. 19, 1954 |
| 2,710,952 | Steagall | June 14, 1955 |

OTHER REFERENCES

National Bureau of Standards Technical News Bulletin, October 1954, volume 38, No. 10, pages 145–148, "Diode Amplifier."

UNITED STATES PATENT OFFICE

CERTIFICATE OF CORRECTION

Patent No. 2,825,820 March 4, 1958

John C. Sims, Jr.

It is hereby certified that error appears in the printed specification of the above numbered patent requiring correction and that the said Letters Patent should read as corrected below.

Column 6, line 27, for "fall" read -- pull --; column 7, line 52, after "comprising" strike out "a"; column 9, line 11, for "condition" read -- conduction --; line 23, for "substantial" read -- substantially --.

Signed and sealed this 21st day of October 1958.

(SEAL)
Attest:

KARL H. AXLINE
Attesting Officer

ROBERT C. WATSON
Commissioner of Patents